United States Patent
Stevens et al.

(10) Patent No.: US 8,239,796 B2
(45) Date of Patent: Aug. 7, 2012

(54) METHOD AND SYSTEM FOR SYNTHESIZING RELATIVE TIMING CONSTRAINTS ON AN INTEGRATED CIRCUIT DESIGN TO FACILITATE TIMING VERIFICATION

(75) Inventors: Kenneth S. Stevens, Brighton, UT (US); Yang Xu, Salt Lake City, UT (US)

(73) Assignee: University of Utah, Salt Lake City, UT (US)

( * ) Notice: Subject to any disclaimer, the term of this patent is extended or adjusted under 35 U.S.C. 154(b) by 246 days.

(21) Appl. No.: 12/715,918

(22) Filed: Mar. 2, 2010

(65) Prior Publication Data

US 2011/0161902 A1 Jun. 30, 2011

Related U.S. Application Data

(60) Provisional application No. 61/291,413, filed on Dec. 31, 2009.

(51) Int. Cl.
*G06F 17/50* (2006.01)
*G06F 9/455* (2006.01)
(52) U.S. Cl. .................... 716/108; 716/101; 716/106
(58) Field of Classification Search .................. 716/106, 716/108, 111, 113, 134, 101
See application file for complete search history.

(56) References Cited

U.S. PATENT DOCUMENTS

| | | | | |
|---|---|---|---|---|
| 4,698,760 A * | 10/1987 | Lembach et al. | ............. | 716/113 |
| 5,657,239 A * | 8/1997 | Grodstein et al. | ............ | 716/106 |
| 6,314,553 B1 * | 11/2001 | Stevens et al. | ................ | 716/104 |
| 6,581,197 B1 * | 6/2003 | Foutz et al. | ................... | 716/108 |
| 6,651,223 B2 * | 11/2003 | Yamashita et al. | ............ | 716/102 |
| 7,036,104 B1 * | 4/2006 | Alpert et al. | .................. | 716/114 |
| 8,065,647 B2 * | 11/2011 | Stevens | ........................ | 716/113 |
| 2007/0220462 A1 * | 9/2007 | Lindberg et al. | .................. | 716/5 |
| 2009/0106719 A1 * | 4/2009 | Stevens | ............................. | 716/6 |
| 2009/0210841 A1 * | 8/2009 | Prakash et al. | .................... | 716/6 |

* cited by examiner

*Primary Examiner* — Stacy Whitmore
(74) *Attorney, Agent, or Firm* — Antony P. Ng; Yudell Isidore Ng Russell PLLC

(57) ABSTRACT

A method for synthesizing relative timing (RT) constraints on an integrated circuit design is disclosed. Initially, multiple trace status tables are received, and each of the trace status tables contains a trace error identified by a formal verification engine that was utilized to perform a relative timing (RT) verification on an integrated circuit design. An error causing signal is then recognized for each of the trace errors. For each of error causing signals, two associating signals are identified, and the two associating signals are then utilized to locate a common point of convergence (POC). The POC is further utilized to locate a common point of divergence (POD), and an RT constraint can be generated based on the identified POC and POD. All the generated RT constraints are applied to constrain the integrated circuit design such that the integrated circuit design is able to pass RT verifications in the future without any timing violations.

5 Claims, 5 Drawing Sheets

| | 0 | 1 | 2 | 3 | 4 | 5 |
|---|---|---|---|---|---|---|
| a | S00,0,T,F | S01,1,F,F | S02,1,F,F | S02,1,F,F | S00,1,T,F | S01,2,F,F |
| b | S00,0,T,F | S01,0,T,F | S02,1,F,F | S02,1,F,F | S00,1,T,F | S01,1,T,F |
| ab | A00,0,F,F | A05,0,F,F | A01,0,T,F | A06,1,F,F | A06,1,F,F | A02,1,F,F |
| ac | B00,0,F,F | B05,0,F,F | B05,0,F,F | B05,0,F,F | B01,0,T,F | B01,0,T,T |
| bc | C00,0,F,F | C02,0,F,F | C05,0,F,F | C05,0,F,F | C01,0,T,F | C01,0,T,F |
| c | D00,0,F,F | D03,0,F,F | D03,0,F,F | D01,0,T,F | D12,1,F,F | D12,1,F,F |
| T | init | a+ | b+ | ab- | c+ | a- |

| | 0 | 1 | 2 | 3 | 4 | 5 |
|---|---|---|---|---|---|---|
| a | S00,0,T,F | S01,1,F,F | S02,1,F,F | S02,1,F,F | S00,1,T,F | S01,2,F,F |
| b | S00,0,T,F | S01,0,T,F | S02,1,F,F | S02,1,F,F | S00,1,T,F | S01,1,T,F |
| ab | A00,0,F,F | A05,0,F,F | A01,0,T,F | A06,1,F,F | A06,1,F,F | A02,1,F,F |
| ac | B00,0,F,F | B05,0,F,F | B05,0,F,F | B05,0,F,F | B01,0,T,F | B01,0,T,T |
| bc | C00,0,F,F | C02,0,F,F | C05,0,F,F | C05,0,F,F | C01,0,T,F | C01,0,T,F |
| c | D00,0,F,F | D03,0,F,F | D03,0,F,F | D01,0,T,F | D12,1,F,F | D12,1,F,F |

| T | init | a+ | b+ | ab- | c+ | a- |
|---|---|---|---|---|---|---|

FIG. 4B

METHOD AND SYSTEM FOR SYNTHESIZING RELATIVE TIMING CONSTRAINTS ON AN INTEGRATED CIRCUIT DESIGN TO FACILITATE TIMING VERIFICATION

PRIORITY CLAIM

The present application claims priority under 35 U.S.C. §119(e)(1) to provisional application No. 61/291,413 filed on Dec. 31, 2009, the contents of which are incorporated herein by reference.

BACKGROUND OF THE INVENTION

1. Technical Field

The present invention relates to timing verifications for integrated circuit designs in general, and in particular to a method for synthesizing relative timing constraints on an asynchronous circuit design to facilitate the performance of timing verification on the asynchronous circuit design.

2. Description of Related Art

Asynchronous circuit and protocol designs typically require formal verification in order to ensure the designs can behave correctly under all operating conditions. As part of the performance and timing validation computer-aided design tool flow, relative timing is commonly utilized to verify asynchronous circuit and protocol designs that they are capable of producing certain desirable results. However, most asynchronous circuit and protocol designs cannot be proven of their conformance to their respective specifications during timing verification without the addition of certain relative timing constraints to the design beforehand.

Today, the process of generating path-based relative timing constraints for an asynchronous circuit and/or protocol design for the purpose of timing validation is typically performed manually by a verification engineer with good intuition and exquisite knowledge of asynchronous circuit designs via the aid of a formal verification engine. Suffice to say, such manual process is as time-consuming as it is error-prone. For example, some asynchronous circuit designs can take up to five hours for an expert verification engineer to create a sufficient set of relative timing constraints.

Consequently, it would be desirable to provide an improved method for automatically generating relative timing constraints on an asynchronous circuit or protocol design for the purpose of timing verification.

SUMMARY OF THE INVENTION

In accordance with a preferred embodiment of the present invention, multiple trace status tables are initially received, and each of the trace status tables contains a trace error identified by a formal verification engine that was utilized to perform a relative timing (RT) verification on an integrated circuit design. An error causing signal is then recognized for each of the trace errors. For each of error causing signals, two associating signals are identified, and the two associating signals are then utilized to locate a common point of convergence (POC). The POC is further utilized to locate a common point of divergence (POD), and an RT constraint can be generated based on the identified POC and POD. All the generated RT constraints are applied to constrain the integrated circuit design such that the integrated circuit design is able to pass RT verifications in the future without any timing violations.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIG. 4B is an example of a trace status table;

DETAILED DESCRIPTION OF A PREFERRED EMBODIMENT

I. Introduction

Figure 1:
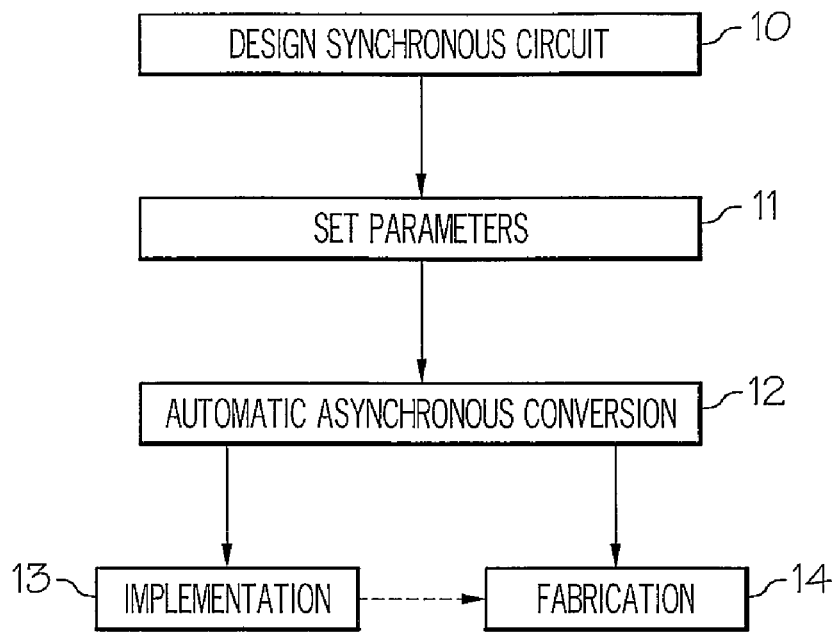
FIG. 1 is a high-level logic flow diagram of an asynchronous circuit development process, in accordance with a preferred embodiment of the present invention.

Referring now to the drawings, and in particular to FIG. 1, there is depicted a high-level logic flow diagram of an asynchronous circuit development process, in accordance with a preferred embodiment of the present invention. As shown, a synchronous circuit is initially designed, as shown in block 10, and the synchronous circuit design can be encoded in a hardware description language (HDL) such as Verilog. Parameters for converting the synchronous circuit design to an asynchronous circuit design are then defined or selected, as depicted in block 11. Parameters that may be defined or selected include a template set, data validity protocols, local constraint parameters, protocol constraint parameters, timing constraint parameters, etc. Other parameters such as operating voltages, local constraints, different frequencies, and protocol constraints may also be identified at this point. All the selected parameters are subsequently applied to generate an asynchronous circuit design, as shown in block 12. For example, the clocked network within the synchronous circuit design is replaced with asynchronous control logic. Next, the asynchronous circuit design is implemented, as depicted in block 13, by, for example, loading the asynchronous circuit design onto a field programmable gate array (FPGA) that can be verified and tested. Subsequently, the asynchronous circuit design is translated to a layout for fabrication, as shown in block 14.

II. Formal Verification Engine

Timing verifications of an asynchronous circuit design can be performed via a formal verification (FV) engine. Preferably, a FV engine receives an implementation I, a specification S, and a set of relative timing (RT) constraints C as inputs. The implementation I includes multiple agents that can be logic gates or minimized specifications of protocols using parallel a composition operator such as $I=(P_1|P_2|\ldots P_n)$.

Hierarchical verification can be performed without a specification. For example, asynchronous burst-mode implementations are all timed protocols since they require asynchronous circuits be stabilized before any new inputs can be accepted. The timing constraints of the timed protocols can be verified by composing the minimized specifications in parallel. If one protocol module is not in an accepting state when an input is driven by an associated protocol, computation interference will occur. Thus, at the protocol level, RT constraints may be required for proper implementation without the need for a system level specification.

However, the more common verification task that needs to be performed is the ensuring of an implementation I being conformed to its specification S. For the present embodiment, formal verification employs bisimulation semantics, and conformance verification is applied between implementation I and its specification S by using a set of RT constraints C.

Preferably, a FV engine is built on a labeled transition system defined as follows. A labeled transition system, $(S,T,\{\rightarrow:t\in T\})$, includes a set S of states, a set T of transition labels, and a transition relation $\rightarrow S \subset S$ with S for each $\rightarrow S \times S$ for each T. The labels (or actions) in the labeled transition system are defined as follows:

Input action set names $a \in A$ (the set of names A are inputs I)

Output action set conames $\bar{a} \in A$ (the set of conames A are outputs O). By convention, $\bar{\bar{a}} = a$.

The set of actions or labels $L = A \cup \bar{A}$

The invisible internal action $\tau$ (tau). $\tau \notin L$

The actions of a system are: $Act = L \cup \tau$

The sort(P) of an agent P is its set of observable input and output actions.

There are three classes of errors that can be reported by a FV engine, and they are defined as follows:

i. Computation Interference occurs on an input transition that is unacceptable to an agent at its current state.

ii. Non-conformance indicates that there exists a transition that the specification can perform while the circuit implementation cannot. In other words, the circuit implementation behaves different from the specification.

iii. Deadlock indicates a loop between two or more components that are waiting for each other's triggers to proceed.

Within an FV engine, circuit and protocol timings are represented as a common point of divergence (POD) to a common point of convergence (POC) relative timing constraints that can be expressed as: $POD \mapsto POC_0 \prec POC_1$, where $POC_0 \prec POC_1$ means that $POC_0$ occurs before $POC_1$.

Figure 2:
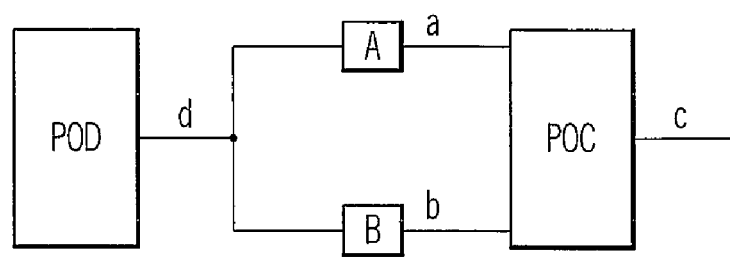
FIG. 2 is a block diagram of a circuit design example.

For the present embodiment, an FV engine performs unbounded delay verifications, i.e., arbitrary delay on gates and/or wires. Thus, some concurrent events can "fire" at an arbitrary order. In FIG. 2, blocks POD and POC represent logic gates, and blocks A and B represent one or more gates in serial or parallel wires. Whether a or b "fires" first is unpredictable based on the unbounded delay model of blocks A and B. If a comes first and makes c unstable and b comes in before c "fires," i.e., b is trying to disable the "firing" of c, then a computation interference occurs. Hence, an RT constraint needs to be enforced on the circuit design in FIG. 2 for specifying the relative ordering of arrivals of events in order to avoid any timing errors. An RT constraint example may be represented as $d+ \mapsto a- \prec b+$.

III. RT Constraints Generation

Based on the RT constraint format, there are two steps in generating RT constraints, namely, finding relative ordering at POC and backtracking POD.

A. Relative Ordering

Relative ordering is an ordering sequence of two events. The fundamental idea of generating relative ordering is by "firing" an enable event before the occurrence of a failure event, because one of the events in relative ordering must be a failure event and the other can be any enabled and ready-to-fire event (known as a dynamic event).

Forcing relative signal sequencing at a component or process is achieved by delaying the occurrence of a signal. Constrained signal sequences will prevent a system from entering error states, which can be enforced locally in a circuit design at which computation interference occurs.

Figure 3:
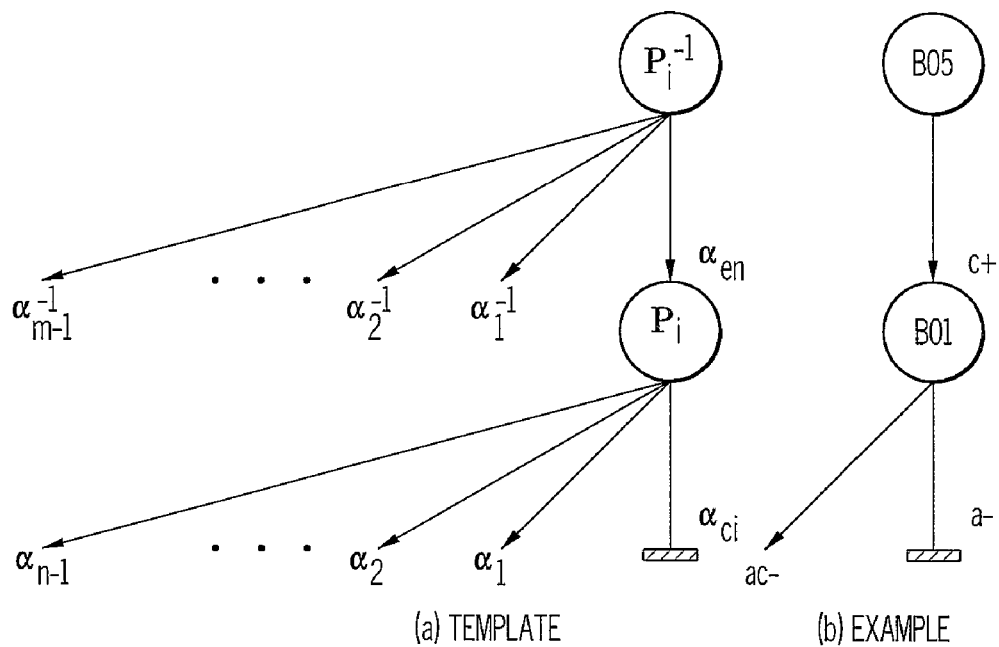
FIG. 3 is an example of a state graph.

All possible signal sequences are provided by a FV engine due to its unbounded device and wire delay model that is utilized for verification. The processes or components that are composed to form the implementation update their semi-modular states incrementally based on the signal execution trace from the FV engine. This allows a trace status table and template graph to be generated. A template graph, as shown in FIG. 3a, can be generated from the set of enabled transitions and current process states.

The template graph of FIG. 3a shows all possible transitions of a process where computation interference occurs. In FIG. 3a, $\alpha_{ci}$ is the computation interference signal. A horizontal bar directed from event $\alpha_{ci}$ indicates a failure transition. $P_i$ is a state where computation interference occurs. $\alpha_{en}$ is the transition moves process from $P_i^{-1}$ to $P_i$. dynamic$(P_i) = \cup_{i=1 \ldots n} \alpha_{n-1} \cup \alpha_{ci}$, and dynamic$(P_i^{-1}) = \cup_{i=1 \ldots m} \alpha_{m-1} \cup \alpha_{en}$.

Due to the unbounded delay used in verification by the FV engine, one cannot predict which event occurs before another among multiple concurrent events. Therefore, the method of the present invention returns a set of all combinations of event orderings for each error. Thus, any action in dynamic$(P_i)$ can be constrained to "fire" before $\alpha_{ci}$ to avoid computation interference. Likewise, any action in dynamic$(P_i^{-1})$ can "fire" before $\alpha_{en}$ to avoid computation interference as well because $P_i$ where computation interference occurs becomes unreachable. There may exist more candidate signal sequencing at a higher level beyond $P_i^{-1}$ that could be used to remove computation interference, but the method of the present invention only use the constraints at the level of $P_i$ and $P_i^{-1}$. Higher level constraints reduce timing margins and may over-constrain the design that could result in a non-conformance to the specification. Note that the constraints returned are mutually exclusive and only one of them is used as a feedback to the FV engine. If a weaker constraint is selected, the cardinality of the final set of RT constraints may be bigger. These constraints also allow choice of the best constraint.

In order to find the relative ordering, signals such as $\alpha_{ci}$, $\alpha_{en}$, $P_i$, $P_i^{-1}$, dynamic$(P_i)$ and dynamic$(P_i^{-1})$ need to be identified and labeled based on their respective behavior. However, this information cannot be identified solely with an error signal trace passed from the FV engine. Thus, a trace status table is constructed to include all the necessary information that reflects the changes of each gate's status as the signal trace grows incrementally.

Figure 4A:
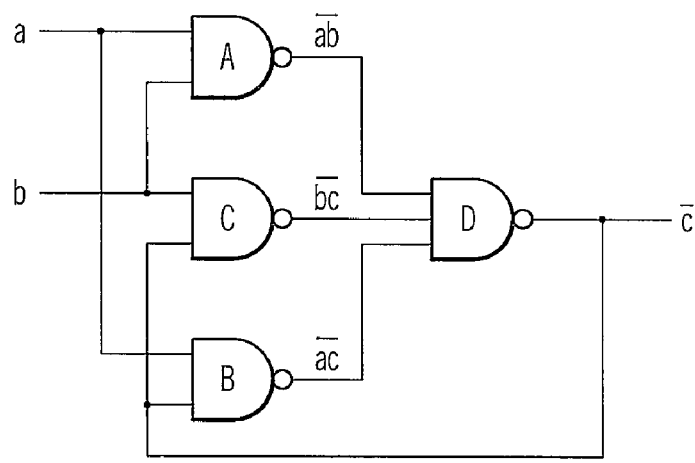
FIG. 4A is a C-element implemented with NAND gates.

FIG. 4b is an example of a trace status table for a circuit of FIG. 4a. The signal trace that results in the computation interference error is listed on the bottom row of the trace status table. The signals show the logic level of their transition as either a "+" for a rising transition or "−" for a falling transition. The other rows in trace status table list a signal and the process that generates that signal. Primary inputs are generated by the specification if provided or are unconstrained. The other signals are process outputs; in this case, the outputs of gates A to D in FIG. 4b. The full signal set, which includes primary inputs, primary outputs, and internal signals, is listed in the first column. Subsequent columns are numbered based on the depth of the signal trace. Each of the columns in the trace status table represent all necessary signal status information. This information includes the state of the module, the number of transitions this signal has made, whether the signal is enabled and ready to "fire" (EN flag), and whether computation interference occurs on this signal as a result of the trace (CI flag). Generation of the trace status table in FIG. 4b requires the trace information from the FV engine as well as the behavior of the individual parallel processes comprising the implementation.

All necessary information for the algorithm can be calculated from the trace status table. Computation interference occurs in the module where the CI flag becomes asserted. This identifies the process that defines the POC. The signal that results in the violation is $\alpha_{ci}$. It is normally the last signal transition in the trace. The enabling signal $\alpha_{en}$ is found by observing the causality indicated by the signal enabled flag (c+). $P_i$ and $P_i^{-1}$ are associated with $\alpha_{en}$ (B05 and B01 for $P_i^{-1}$ and $P_i$, respectively, in FIG. 3 for the present example). dynamic($P_i$) and dynamic($P_i^{-1}$) can be derived by searching enabled inputs and outputs of the agent at $P_i$ and $P_i^{-1}$.

B. POD Backtracking

The POD/POC pair specifies the paths in a race between two events. Once the POC has been defined, the POD can be identified. The method of the present invention defines the POD by backtracking the causality of the two events selected in the POC identification. In this case, $\alpha_{ci}(a-)$ and $\alpha_{en}(c+)$ are utilized. The trace status table provides an easy way to identify the causal relationship between signal transitions in the trace by observing the EN flags of the signals. By default, the method of the present invention turns the last common causal signal transition as the POD. To facilitate pre-layout and post-layout timing validation of these constraints, a feature that supports user-specified POD can be added.

Figure 5:
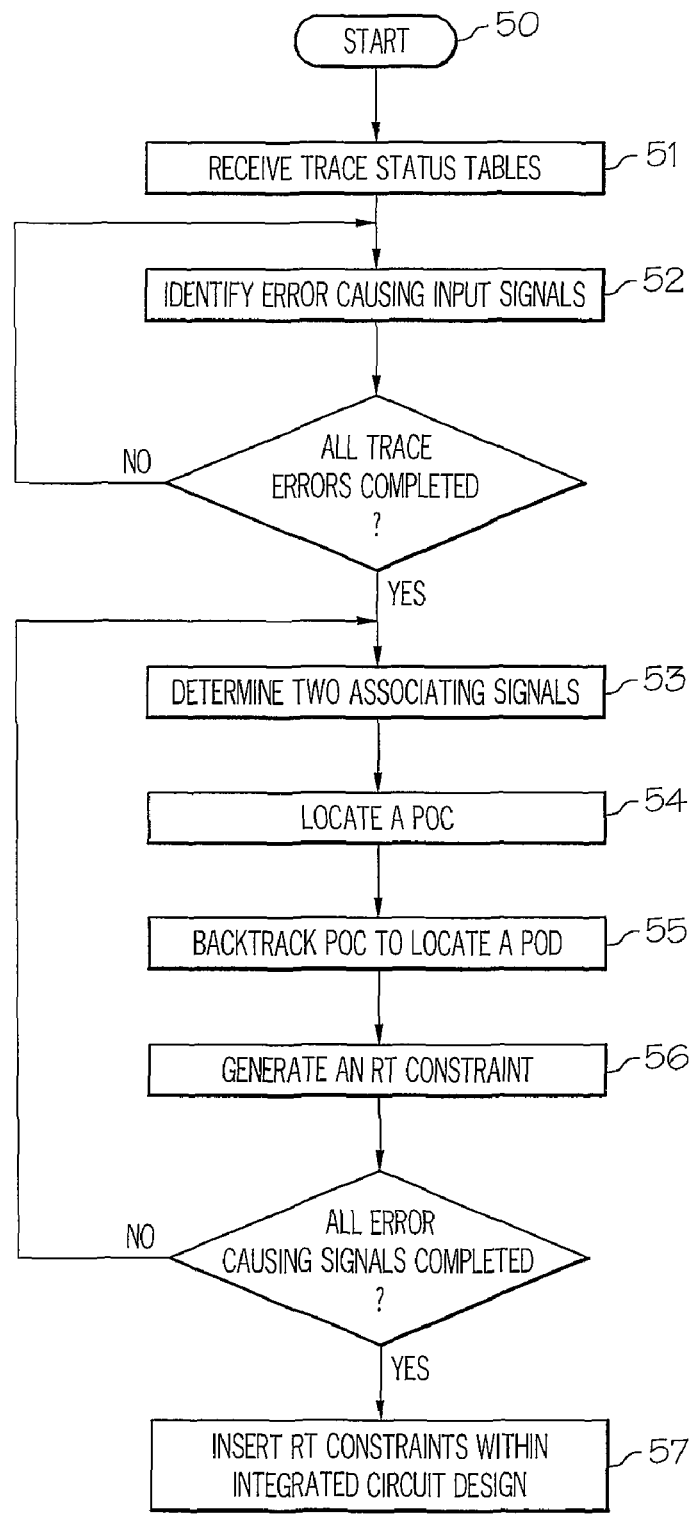
FIG. 5 is a high-level logic flow diagram of a method for synthesizing relative timing constraints on an asynchronous circuit design, in accordance with a preferred embodiment of the present invention.

Referring now to FIG. 5, there is illustrated a high-level logic flow diagram of a method for generating RT constraints on an asynchronous circuit design, in accordance with a preferred embodiment of the present invention. Starting at block 50, multiple trace status tables are received, as shown in block 51. Preferably, each of the trace error tables contains a trace error identified by a FV engine that performed an RT verification on an integrated circuit design. An error causing signal is then identified for each of the trace errors, as depicted in block 52. The error causing signal can be an input signal, an output signal or a signal within a block. For each of the identified error causing signals, two associating signals are determined, as shown in block 53. The two associating signals are subsequently utilized to locate a common point of convergence (POC), as depicted in block 54. Next, the POC is backtracked to locate a common point of divergence (POD), as shown in block 55. An RT constraint is generated based on the POC and POD, as depicted in block 56. An RT constraint for each of the trace errors is inserted within the integrated circuit design, as shown in block 57. The RT constraints specify the relative ordering of arrivals of signals in order to avoid any timing error during RT verifications. As a result, the integrated circuit design is capable of passing RT verifications.

Figure 6:
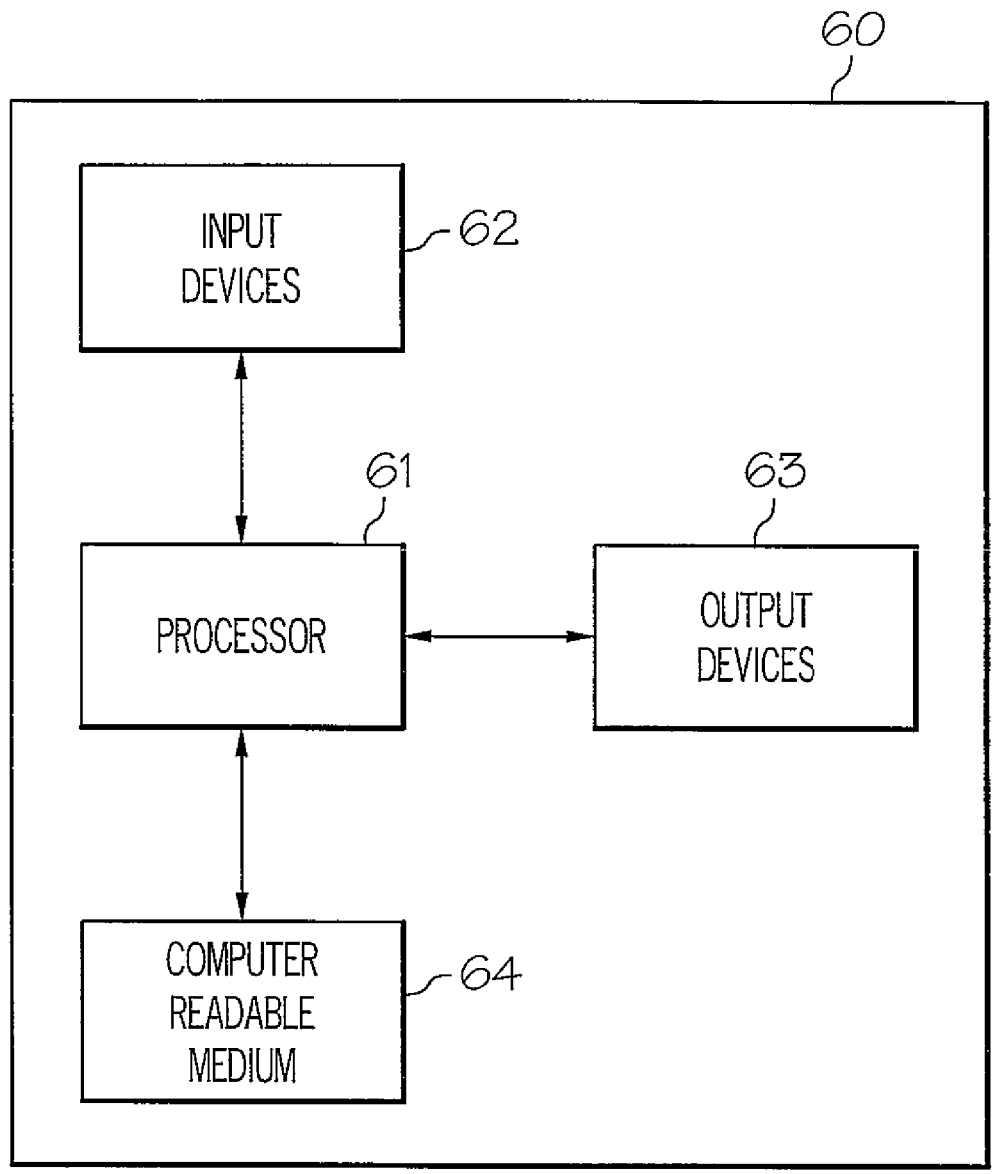
FIG. 6 is a block diagram of an integrated circuit design system, in accordance with a preferred embodiment of the present invention.

With reference now to FIG. 6, there is depicted a block diagram of an integrated circuit design system, in accordance with a preferred embodiment of the present invention. As shown, an integrated circuit design system 60 includes a processor 61, input devices 32, output devices 63, and a computer-readable medium 64. Processor 61 executes instructions as known to those skilled in the art. Input devices 62 may include a keyboard, a pen and touch screen, a mouse, a track ball, etc. to allow a user to enter information into integrated circuit design system 60. Output devices 63 may include a display, a printer, a speaker, etc. Computer-readable medium 64 may include any type of memory such as random access memory, read-only memory, magnetic storage devices (e.g., hard disk and magnetic tapes), optical disks, etc.

As has been described, the present invention provides a method for automatically synthesizing RT constraints on an asynchronous circuit or protocol design for the purpose of timing verification.

It is also important to note that although the present invention has been described in the context of a fully functional computer system, those skilled in the art will appreciate that the mechanisms of the present invention are capable of being distributed as a computer program product in a variety of computer storage media such as compact discs.

While the invention has been particularly shown and described with reference to a preferred embodiment, it will be understood by those skilled in the art that various changes in form and detail may be made therein without departing from the spirit and scope of the invention.

What is claimed is:

1. A computer system for automatically synthesizing relative timing (RT) constraints for facilitating timing verifications of an integrated circuit design, said computer system comprising:
   means for receiving a plurality of trace status tables containing a plurality of trace errors identified by a formal verification engine that performed an RT verification on an integrated circuit design;
   means for identifying an error causing signal for each of said trace errors;
   for each of error causing signals,
      means for determining two associating signals;
      means for utilizing said two associating signals to locate a common point of convergence (POC);
      means for backtracking said POC to locate a common point of divergence (POD); and
      means for generating an RT constraint based on said POC and POD; and
   means for inserting an RT constraint for each of said trace errors within said integrated circuit design, wherein said RT constraints specify the relative ordering of arrivals of signals in order to avoid any timing violations such that said integrated circuit design is able to pass said RT verification in the future.

2. The computer system of claim 1, wherein said integrated circuit design is an asynchoronous integrated circuit design.

3. The computer system of claim 1, wherein said RT verification is an unbound verification.

4. The computer system of claim 1, wherein said error causing signal is an input signal.

5. The computer system of claim 1, wherein said error causing signal is an output signal.

* * * * *